United States Patent [19]
Manaka

[11] Patent Number: 5,888,761
[45] Date of Patent: Mar. 30, 1999

[54] ETCHING METHOD FOR FORMING AIR BRIDGE PATTERN ON SILICON SUBSTRATE

[75] Inventor: Junji Manaka, Tokyo, Japan

[73] Assignee: Ricoh Seiki Company, Ltd., Tokyo, Japan

[21] Appl. No.: 909,820

[22] Filed: Aug. 12, 1997

Related U.S. Application Data

[63] Continuation of Ser. No. 139,696, Oct. 22, 1993, Pat. No. 5,683,546.

[30] Foreign Application Priority Data

Oct. 23, 1992 [JP] Japan ..................... 4-309406

[51] Int. Cl.$^6$ .................................. H01L 21/00
[52] U.S. Cl. ................. 438/52; 438/753; 438/798
[58] Field of Search .................. 156/625, 643.1, 156/628.1, 633.1, 647, 654.1, 616, 654; 438/52, 753, 798

[56] References Cited

U.S. PATENT DOCUMENTS

| | | |
|---|---|---|
| 3,728,179 | 4/1973 | Davison et al. . |
| 4,141,765 | 2/1979 | Druminski et al. . |
| 4,147,564 | 4/1979 | Magee et al. . |
| 4,172,005 | 10/1979 | Muraoka et al. . |
| 4,398,962 | 8/1983 | Kanazawa . |
| 4,579,601 | 4/1986 | Samata et al. . |
| 4,682,503 | 7/1987 | Higashi et al. . |
| 4,808,260 | 2/1989 | Sickafus et al. . |
| 4,982,263 | 1/1991 | Spratt et al. . |
| 5,242,533 | 9/1993 | Trah et al. . |
| 5,254,209 | 10/1993 | Schmidt et al. . |
| 5,283,201 | 2/1994 | Tsang et al. . |
| 5,286,343 | 2/1994 | Hui . |
| 5,683,546 | 11/1997 | Manaka ................. 156/643.1 |

FOREIGN PATENT DOCUMENTS

| | | |
|---|---|---|
| A 4019821 | 1/1991 | Germany . |
| 4037202 | 5/1992 | Germany . |
| 52-0043370 | 4/1977 | Japan . |
| 53-0120376 | 10/1978 | Japan . |
| 57-0100734 | 6/1982 | Japan . |
| 58-0151027 | 9/1983 | Japan . |
| 60-0041232 | 3/1985 | Japan . |
| 60-0218848 | 11/1985 | Japan . |
| 61-0171139 | 8/1986 | Japan . |
| 62-0109323 | 5/1987 | Japan . |
| 62-0208634 | 9/1987 | Japan . |
| 0239935 | 9/1989 | Japan . |
| 0028927 | 1/1990 | Japan . |
| 91/03074 | 3/1991 | WIPO . |
| A 9200602 | 1/1992 | WIPO . |

OTHER PUBLICATIONS

"Method of... and Applications of the Method," IBM TEchnical Dis Bull., Hinkel et al., vol. 24, No. 11B, Apr. 1982.
"Fabrication of microchannels by laser machining and anisotropic etching of silicon," *Sensors and Acuators*, vol. 32, No. 1–3, Apr., 1992.
"Etch Stop Barriers in Silicon Produced by Ion Implantation of Electrically Non–Active Species," *Journal of the Electrochemical Society*, 139, No. 8, Aug. 1992.
320 *Applied Physics Letters*, vol. 40, No. 4, Feb., 1982.

*Primary Examiner*—Peter Toby Brown
*Assistant Examiner*—Long Pham
*Attorney, Agent, or Firm*—McDermott, Will & Emery

[57] ABSTRACT

The present invention is for enlarging a freedom of layout including an air bridge pattern and enhancing the availability for various purposes. A mask layer including an air bridge pattern is formed on a (100) plane of a silicon substrate, isotropic etching is carried out until a point of intersection between tangents of a peripheral curved plane comes to under the air bridge pattern plane, and then an air bridge is formed by means of anisotropic etching.

2 Claims, 19 Drawing Sheets

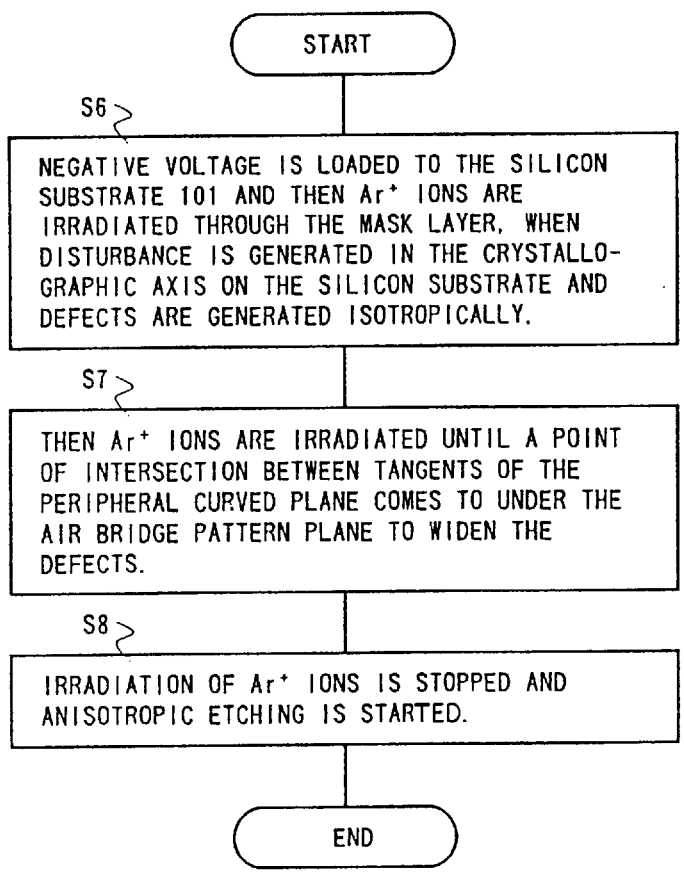

(D-D)

(E-E)

(F-F)

(G-G)

ETCHING METHOD FOR FORMING AIR BRIDGE PATTERN ON SILICON SUBSTRATE

This application is a continuation of application Ser. No. 08/139,696 filed Oct. 22. 1993, now U.S. Pat. No. 5,683,546.

FIELD OF THE INVENTION

The present invention relates to an etching method for silicon substrate comprising a step of forming an air bridge by making use of difference in etching rate for each crystal plane of silicon.

BACKGROUND OF THE INVENTION

When an air bridge is formed on a silicon substrate, generally a method of forming an air bridge by making use of difference in etching rate for each crystal plane of silicon has been employed. The difference in etching rate for each crystal plane of silicon is the phenomenon that, when a single crystal of silicon is etched with a particular etching liquid (EPW liquid), the etching rate largely varies for each crystal axis and the etching rate in a certain direction (111 direction) is extremely lower than those in other directions (100 direction and 110 direction). As shown in FIGS. 18A and 18B, for instance, when a mask layer 1802 is formed on a (100) plane of a silicon substrate 1801 and the mask layer 1802 is etched with an etching liquid, a cavity surrounded by four (111) planes is formed. In other words, etching proceeds until all planes of the silicon substrate 1801 being exposed to the etching liquid become (111) planes (Refer to FIGS. 18C and 18D). This type of etching is called anisotropic etching.

In the method of forming an air bridge by making use of difference in etching rate for each crystal plane of silicon, an air bridge 1803 is formed, as shown in FIG. 19B or FIG. 20B, by forming the mask layer 1802 on the silicon substrate 1801 having an air bridge pattern as shown in FIG. 19A or FIG. 20A and executing anisotropic etching.

With the conventional type of etching method for silicon substrate, however, although air bridges such as those shown in FIGS. 19 and 20 can be formed, as there are various technological restrictions concerning an air bridge pattern along which an air bridge is formed because of characteristics of anisotropic etching, there have been such problems as limited availability for various purposes and a small freedom in pattern layout on a silicon substrate.

For instance, even if an air bridge pattern 2101 (a portion indicated by dotted lines having a large area as shown in FIG. 21A) is formed, anisotropic etching is completed in the states as shown in FIGS. 21B and 21C, so that an air bridge can not be formed.

On the other hand, the air bridge 1803 can be made larger by employing the cantilever form, but in this case the strength and the stability of the air bridge are rather low. Also the air bridge 1803 can be made larger by forming it in approximately 45 degrees diagonally inclined state, but also in this case the strength and the stability of the air bridge are low. In either case, the freedom of layout on a silicon substrate including an air bridge pattern is extremely low.

SUMMARY OF THE INVENTION

It is an object of the invention to provide an etching method for silicon substrate which aims at enlarging a freedom of layout including an air bridge pattern as well as enhancing the availability of an etching method for silicon substrate for various purposes.

In order to achieve the object as described above, the present invention provides an etching method for silicon substrate for forming an air bridge by making use of difference in etching rate for each crystal plane of silicon, comprising a step of forming a mask layer including a air bridge pattern on a (100) plane of a silicon substrate, a step of executing isotropic etching until a point of intersection between tangents of a peripheral plane surrounding a cavity undercut under the air bridge pattern comes to under the air bridge pattern plane, and then a step of forming an air bridge by means of anisotropic etching.

And, the present invention provides an etching method for silicon substrate, comprising a step of forming a mask layer including an air bridge pattern on a (100) plane of a silicon substrate, a step of generating defects in the crystal structure in a portion of silicon substrate not having a mask layer thereon, and a step of forming an air bridge by means of anisotropic etching.

Further, the present invention provides an etching method for silicon substrate for making an air bridge by making use of difference in etching rate for each crystal plane of silicon, comprising a step of forming a mask layer including an air bridge pattern on a (100) plane of a silicon substrate, a step of generating isotropic defects in crystal structure of silicon substrate by electrically irradiating ions of inactive element which is heavier than Si, and a step of forming an air bridge by means of anisotropic etching.

Furthermore, the present invention provides an etching method for silicon substrate for forming an air bridge by making use of difference in etching rate for each crystal plane of silicon, comprising a step of forming a mask layer including an air bridge pattern on a (100) plane of a silicon substrate, a step of generating isotropic defects in crystal structure of the silicon substrate by irradiating ions of inactive element which is heavier than Si using the sputter etching process, and a step of forming an air bridge by means of anisotropic etching.

Still furthermore, the present invention provides an etching method for silicon substrate for forming an air bridge by making use of difference in etching rate for each crystal plane of silicon, comprising a step of forming a mask layer including an air bridge pattern on a (100) plane of a silicon substrate, a step of forming a vertical trench on the silicon substrate using the plasma etching process, and a step of forming an air bridge by means of anisotropic etching.

In the etching method for silicon substrate according to the present invention, after isotropic etching is executed, anisotropic etching is carried out to form an air bridge.

Also in the etching method for silicon substrate according to the present invention, after defects are generated in a portion of a silicon substrate having no mask layer thereon, anisotropic etching is carried out to form an air bridge.

Also in the etching method for silicon substrate according to the present invention, after isotropic defects are generated in crystallographic axis of a silicon substrate by electrically irradiating ions of inactive element which is heavier than Si, anisotropic etching is carried out to form an air bridge.

Furthermore in the etching method for silicon substrate according to the present invention, after isotropic defects are generated in crystallo-graphic axis of a silicon substrate by irradiating ions of inactive element which is heavier than Si using a sputter etching process, and a step of forming an air bridge by means of anisotropic etching.

Still furthermore in the etching method for silicon substrate according to the present invention, after the vertical trench is formed on a silicon substrate using a plasma etching process, anisotropic etching is carried out to form an air bridge.

Other object and features of this invention will become understood from the following description with reference to the accompanying drawings.

BRIEF DESCRIPTION OF THE DRAWINGS

FIG. 6A is a drawing illustrating a case where the etching method for silicon substrate according to Embodiment 1 was carried out with a different air bridge pattern used as a mask layer, while

FIG. 8 is a flow chart illustrating an etching method according to Embodiment 2;

DESCRIPTION OF THE EMBODIMENTS

Now detailed description is made hereinafter for the etching method for silicon substrate according to the present invention in the order of Embodiment 1, Embodiment 2, Embodiment 3 and Embodiment 4 with reference to the related drawings.

EMBODIMENT 1

The etching method for silicon substrate according to Embodiment 1 comprises a step of forming a mask layer including a air bridge pattern on a (100) plane of a silicon substrate, a step of executing isotropic etching until a point of intersection between tangents of a peripheral plane surrounding a cavity undercut under the air bridge pattern comes to under the air bridge pattern plane, and then a step of forming an air bridge by means of anisotropic etching.

Figure 1A:
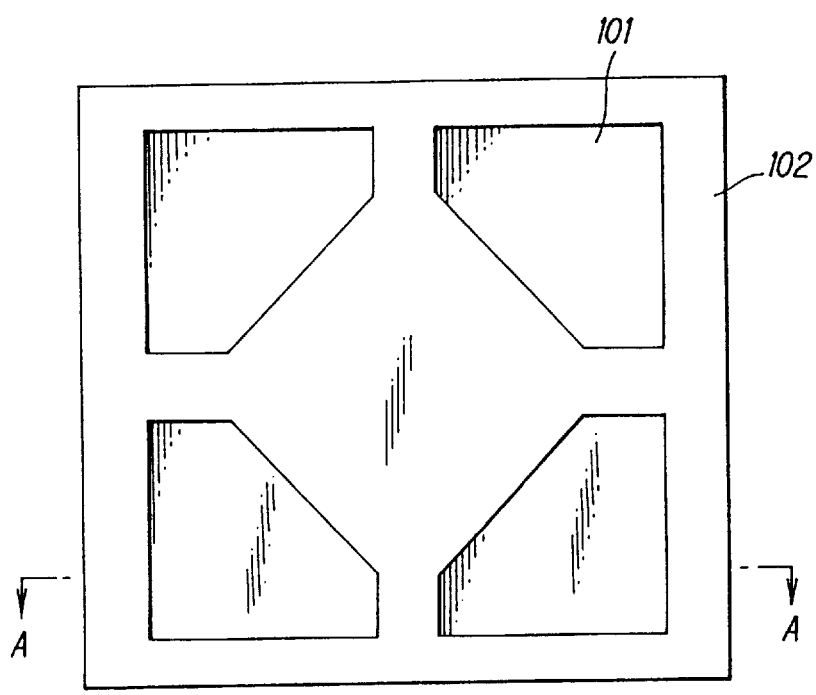
FIG. 1 is a drawing illustrating a state where a mask layer including an air bridge has been formed on a silicon substrate according to Embodiment 1.
Figure 1B:
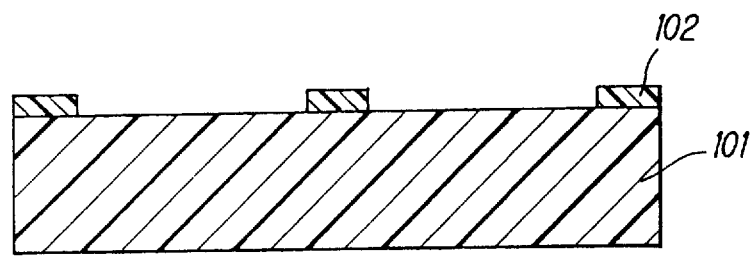

FIGS. 1A and 1B shows a state where a mask layer 102 including an air bridge pattern has been formed on a silicon substrate 101 in Embodiment 1, in other words a state before etching is started. Herein, the mask layer is a $SiO_2$ layer.

Figure 2A:
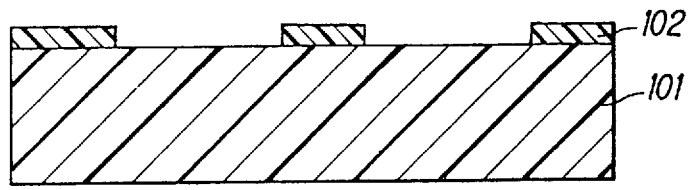
FIG. 2 is a cross sectional view illustrating a state during the processing in Embodiment 1 taken along lines A—A in FIG. 1A.
Figure 2B:
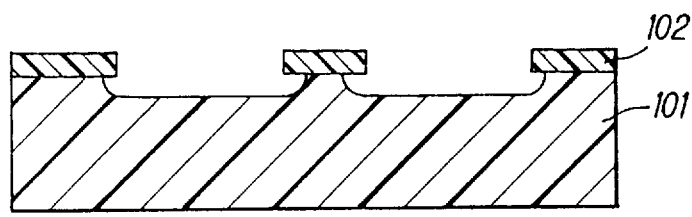
Figure 2C:
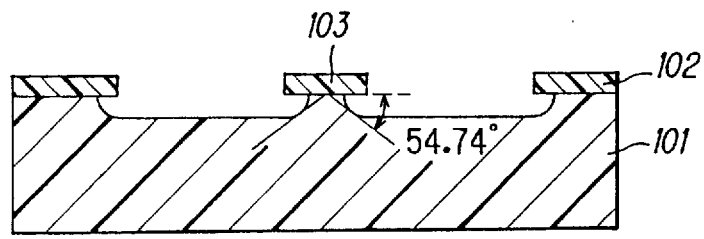
Figure 2D:
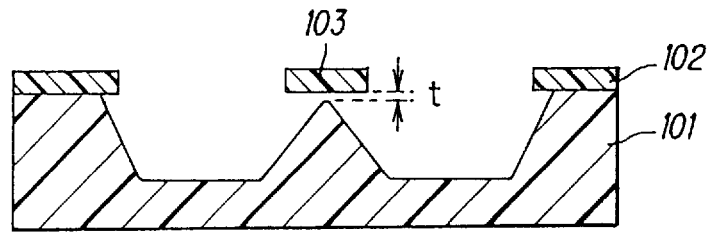
Figure 2E:
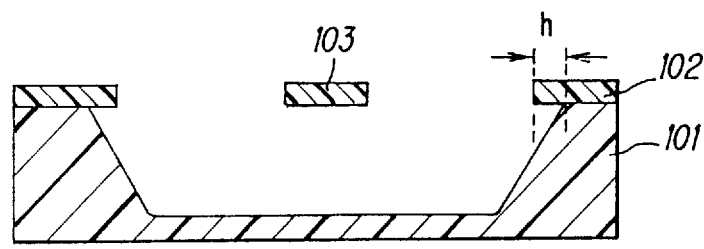
Figure 3:
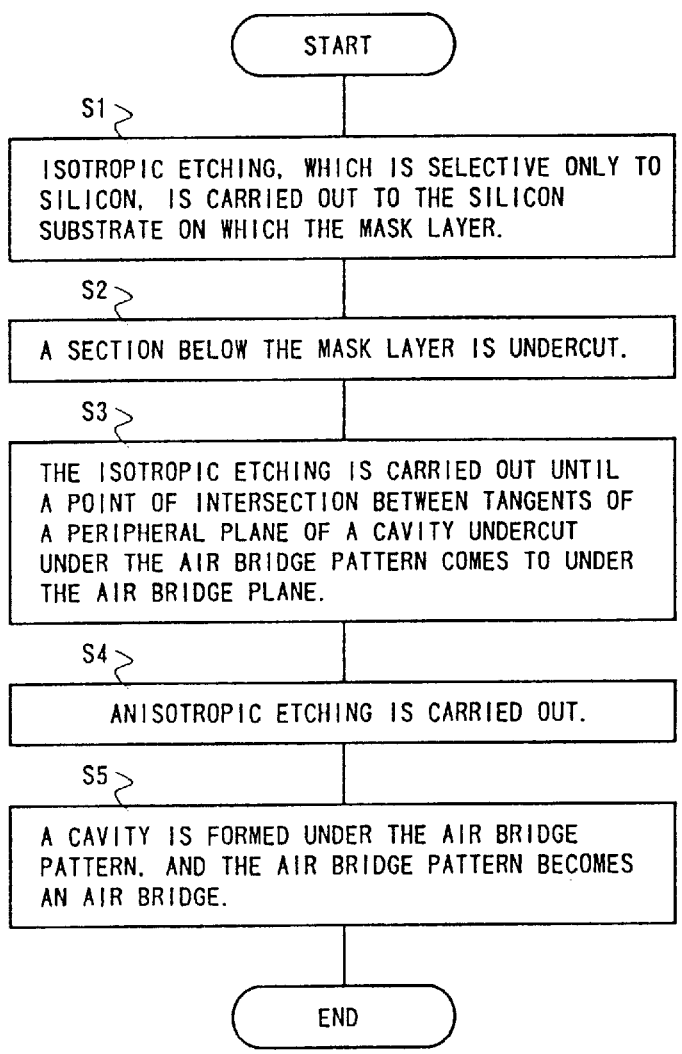
FIG. 3 is a flow chart illustrating an etching method according to Embodiment 1.

Assuming the configuration as described above, now description is made for the etching process with reference top FIGS. 2A to 2E as well as to the flow chart shown in FIG. 3. At first, isotropic etching, which is selective only to silicon, is carried out to the silicon substrate on which the mask layer 102 as shown in FIG. 2A has been formed (S1). With isotropic etching, etching proceeds as shown in FIG. 2B, and also a section below the mask layer 102 is undercut (S2). The isotropic etching is carried out until a point of intersection between tangents of a peripheral plane of a cavity undercut under the air bridge pattern 103 comes to under the air bridge plane 103, as shown in FIG. 2C (S3).

When anisotropic etching is furthermore carried out from the state shown in FIG. 2C (S4), the etching process proceeds via the state as shown in FIG. 2D to the state as shown in FIG. 2E, a cavity is formed under the air bridge pattern 103, and the air bridge pattern 103 becomes an air bridge (S5). Herein, the gap t in FIG. 2D is equal to the gap between a point of intersection between tangents and the air bridge pattern 103 plane in FIG. 2C. It is desirable that the gap t is larger than 0.1 $\mu$m (t>0.1 $\mu$m). The width h of the undercut in FIG. 2E is larger than 0.1 $\mu$m (h>0.1 $\mu$m).

Figure 4A:
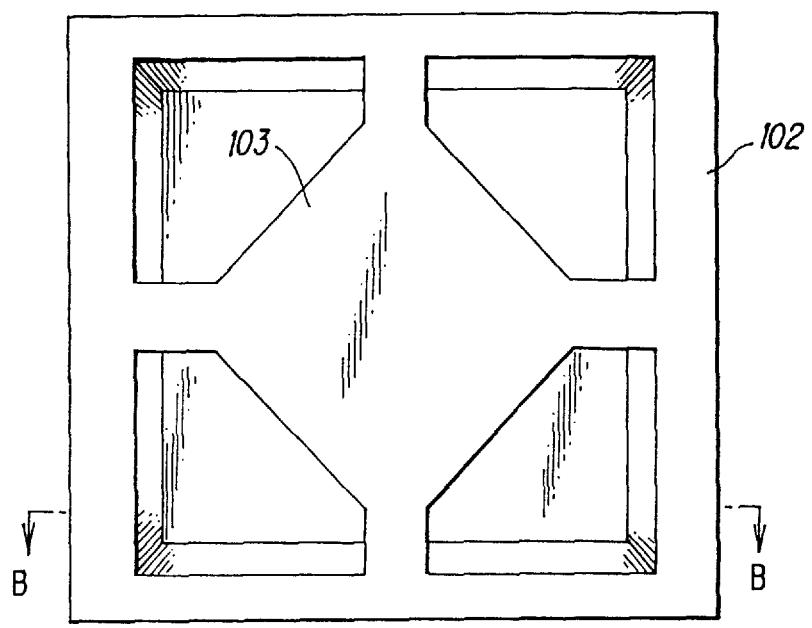
FIG. 4 is a drawing illustrating the final state after the processing in Embodiment 1 was executed to the state as shown in FIGS. 1A and 1B.
Figure 4B:
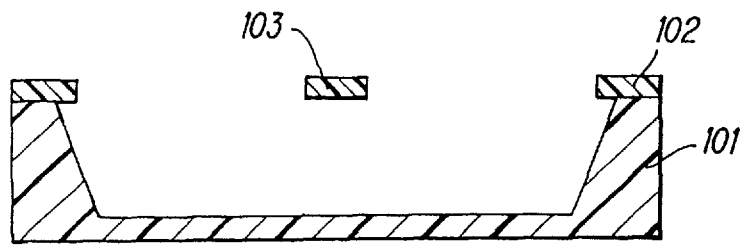
Figure 5:
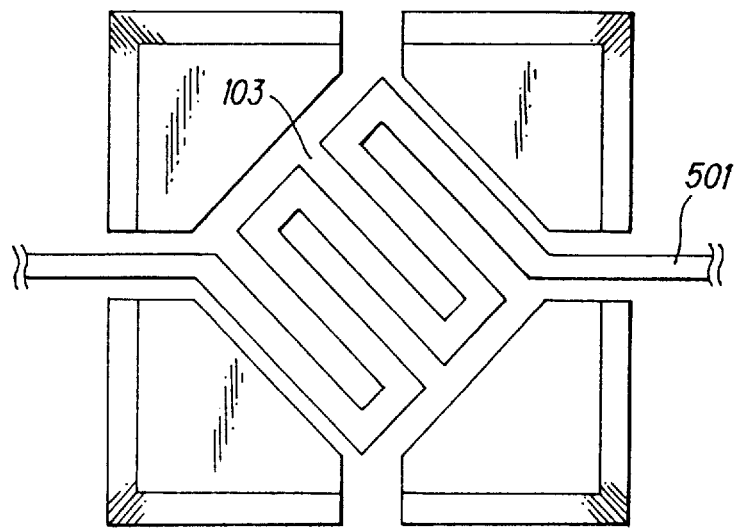
FIG. 5 is a drawing illustrating a case where a flow sensor was formed by using an air bridge formed in Embodiment 1.

FIGS. 4A and 4B shows the final state of what is shown in FIGS. 1A and 1B. As show in these figures, the air bridge pattern having a large area is completed as an air bridge. The air bridge is supported at four corners, so that its stability is high. FIG. 5 shows a case where a flow sensor has been formed using the air bridge formed as described above. A heater 501 can efficiently be wired on the air bridge 103.

Figure 6A:
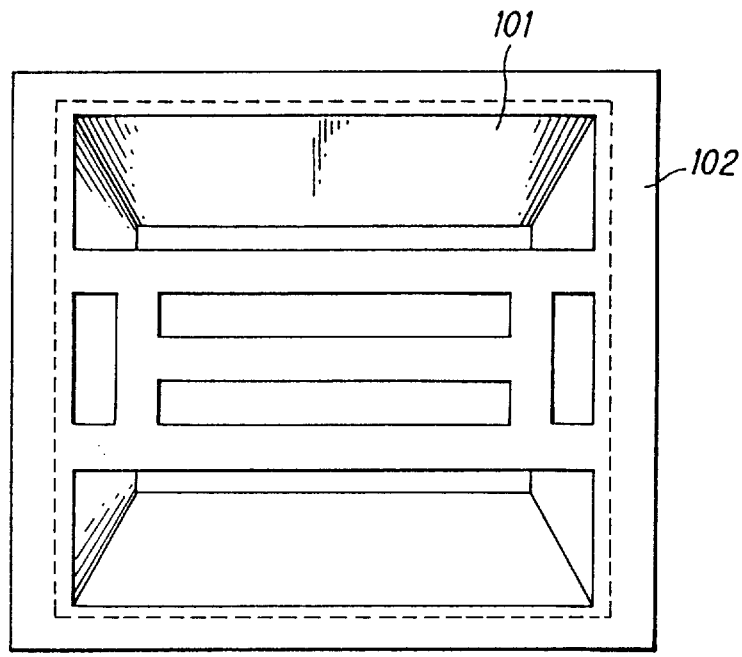
Figure 6B:
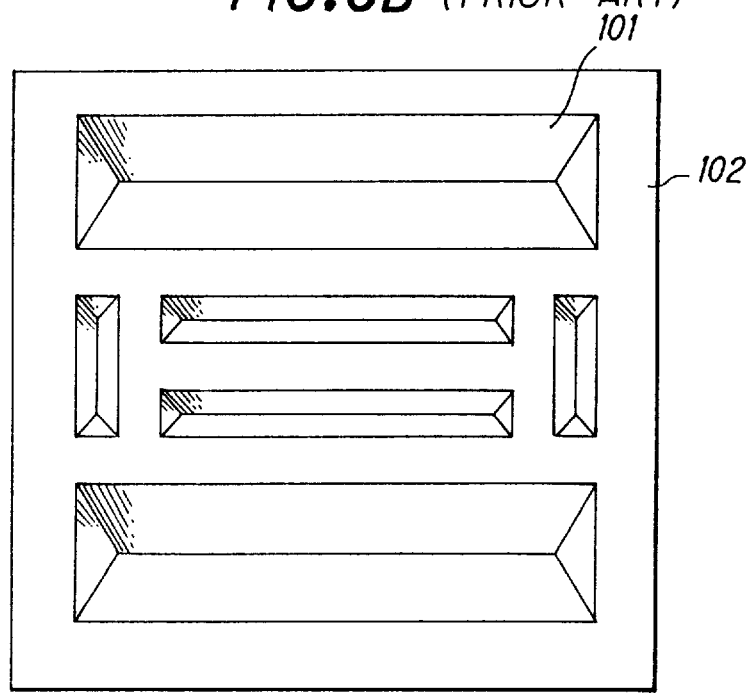
FIG. 6B shows a case where the same processing was carried out by using a conventional type of etching method for silicon substrate.

FIG. 6A shows a case where the silicon substrate etching method in Embodiment was carried out employing a different air bridge pattern as a mask layer, while FIG. 6B shows an example for comparison in which a silicon substrate was processed by using a conventional type of etching method for silicon substrate. As shown in FIG. 6B the air bridge can not be formed by using only anisotropic etching, but by carrying out isotropic etching and then anisotropic etching as shown in FIG. 6A, it is possible to form a cavity even under a pattern surrounded by straight lines located at 0 or 90 degrees against the (100) plane of the silicon substrate and form an air bridge there.

EMBODIMENT 2

The etching method in Embodiment 2 comprises a step of forming a mask layer including an air bridge pattern on a (100) plane of a silicon substrate, a step of generating isotropic defects in the crystal structure of silicon substrate by electrically irradiating ions of inactive element which is heavier than Si, and then a step of forming an air bridge by means of anisotropic etching. It should be noted that use of the same air bridge pattern as that in FIGS. 1 A and 1B is assumed also in Embodiment 2.

Figure 7A:
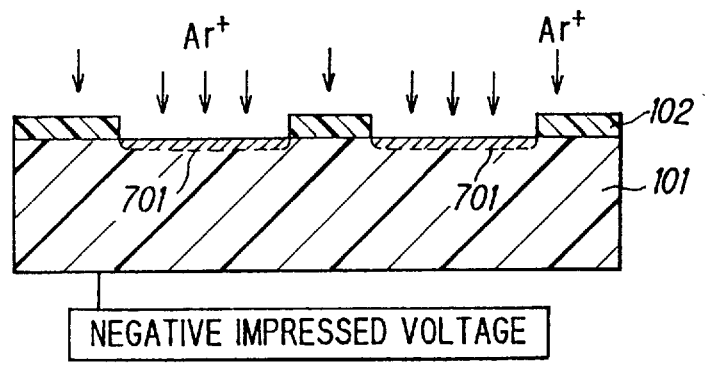
FIG. 7 is a cross sectional view illustrating a state during the processing in Embodiment 2 taken along lines A—A in FIG. 1A.
Figure 7B:
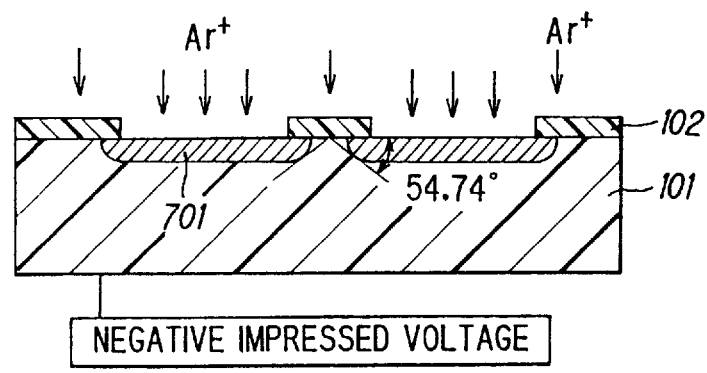
Figure 7C:
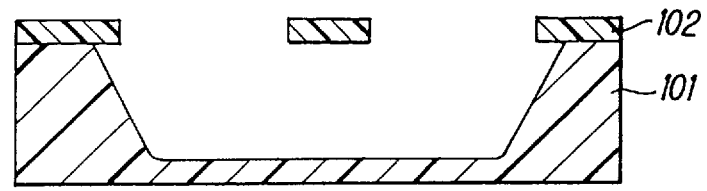

FIGS. 7A to 7C are cross sectional views each illustrating a state of the silicon substrate during the process step in FIG. 1A taken along lines A—A, and FIG. 8 is a flow chart illustrating the process steps. At first, negative voltage is loaded to the silicon substrate 101 and then $Ar_+$ ions are irradiated through the mask layer 102, when disturbance is generated in the crystallographic axis on the silicon substrate 101 and defects 701 are generated isotropically (S6).

Then $Ar^+$ ions are irradiated until a point of intersection between tangents of the peripheral curved plane comes to under the air bridge pattern plane to widen the defects 710 (S7). When the state as shown in FIG. 7B is achieved, irradiation of $Ar^+$ ions is stopped and anisotropic etching is stared (S8). Finally the state as shown in FIG. 7C is attained by means if anisotropic etching, thus an air bridge being formed. So, the same effect as that in Embodiment 1 can be obtained in Embodiment 1.

EMBODIMENT 3

The etching method for silicon substrate in Embodiment 3 comprises a step of forming a mask layer including an air bridge pattern on a (100) plane of a silicon substrate, a step of generating isotropic defects in crystal structure of a silicon substrate by irradiating ions of inactive element which is heavier than Si using the sputter etching process, and then a step of forming an air bridge by means of anisotropic etching. It should be noted that use of the same air bridge pattern as that in FIGS. 1A and 1B is assumed also in Embodiment 3.

Figure 9A:
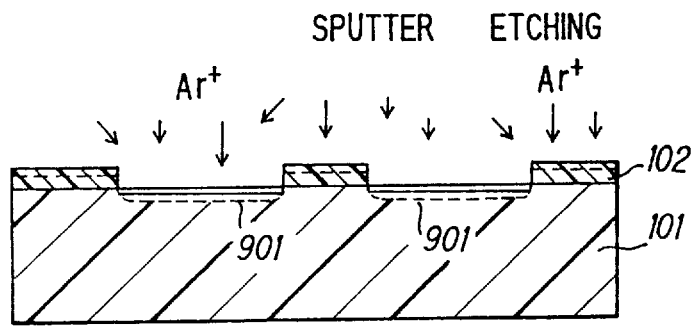
FIG. 9 is a cross sectional view illustrating a state during the processing according to Embodiment 3 taken along lines A—A in FIG. 1A.
Figure 9B:
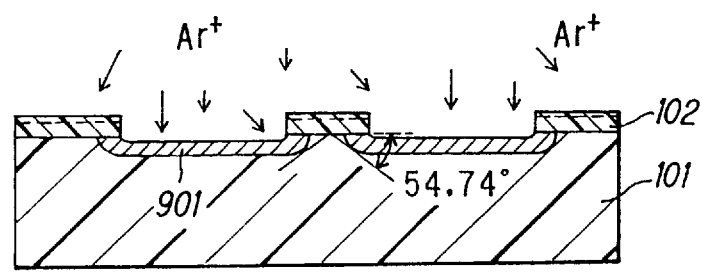
Figure 9C:
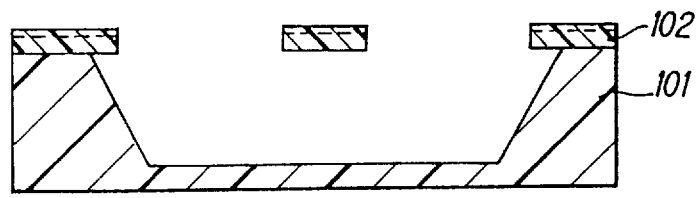
Figure 10:
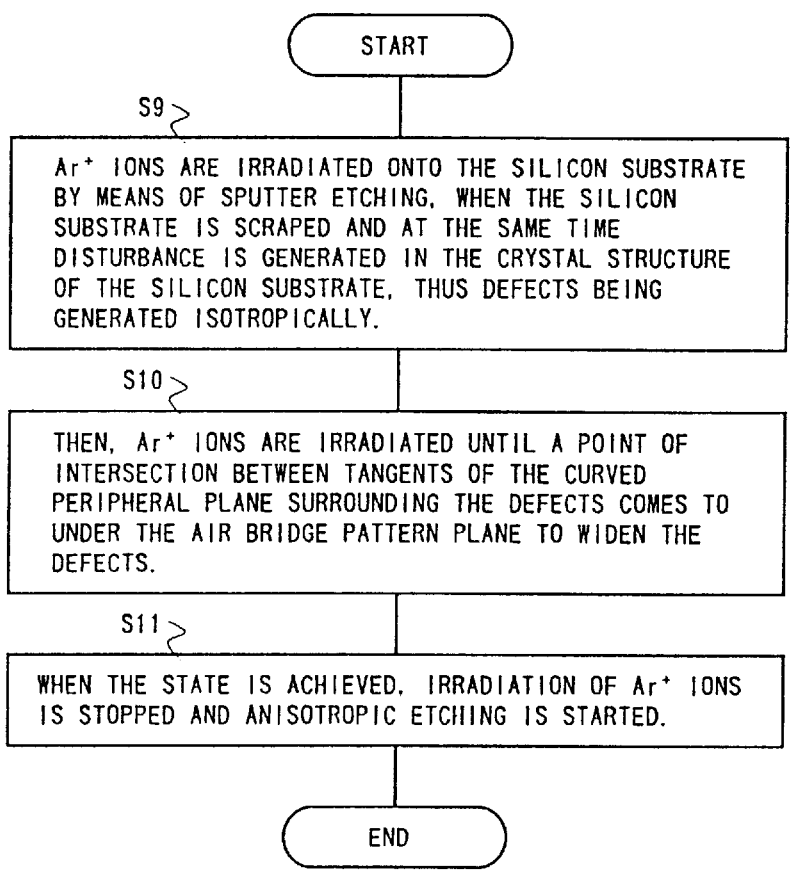
FIG. 10 is a flow chart illustrating an etching method according to Embodiment 3.

FIGS. 9A to 9C are cross sectional views each illustrating a state of the silicon substrate shown in FIG. 1A during the process step taken lines A—A in FIG. 1A, and FIG. 10 is a flow chart illustrating the process steps. At first, $Ar^+$ ions are irradiated onto the silicon substrate 101 by means of sputter etching, when the silicon substrate 101 is scraped as shown in FIG. 9A and at the same time disturbance is generated in the crystal structure of the silicon substrate 101, thus defects 901 being generated isotropically (S9).

Then, $Ar^+$ ions are irradiated until a point of intersection between tangents of the curved peripheral plane surrounding the defects comes to under the air bridge pattern plane to widen the defects 901 (S10). When the state as shown in FIG. 9B is achieved, irradiation of $Ar^+$ ions is stopped and anisotropic etching is started (S11). The final state as shown in FIG. 9C is attained by means of anisotropic etching, and thus an air bridge is formed. As described above, the same effect as that in Embodiment 1 can be attained also in Embodiment 3.

EMBODIMENT 4

The etching method for silicon substrate in Embodiment 4 comprises a step of forming a mask layer including an air bridge pattern on a (100) plane of a silicon substrate, a step of forming a vertical trench on the silicon substrate by using the plasma etching method, and then a step of forming an air bridge by means of anisotropic etching. It should be noted that use of the same air bridge pattern as that in FIGS. 1A and 1B is assumed also in Embodiment 4.

Figure 11A:
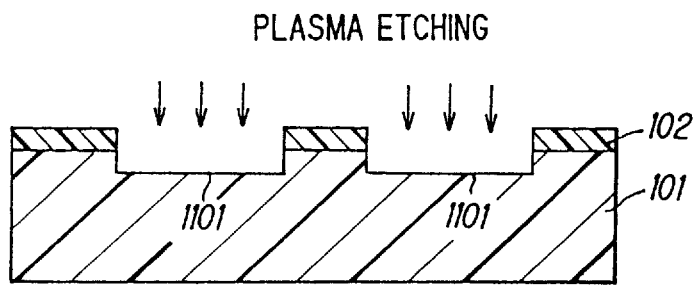
FIG. 11 is a cross sectional view illustrating a state during the processing in Embodiment 4 taken along lines A—A in FIG. 1A.
Figure 11B:
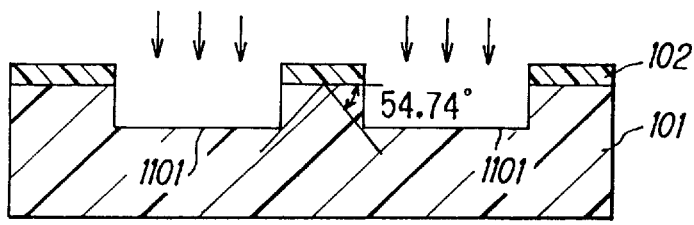
Figure 11C:
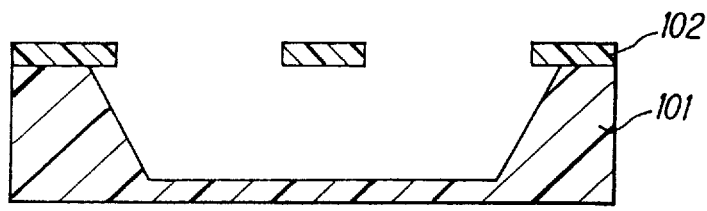
Figure 12:
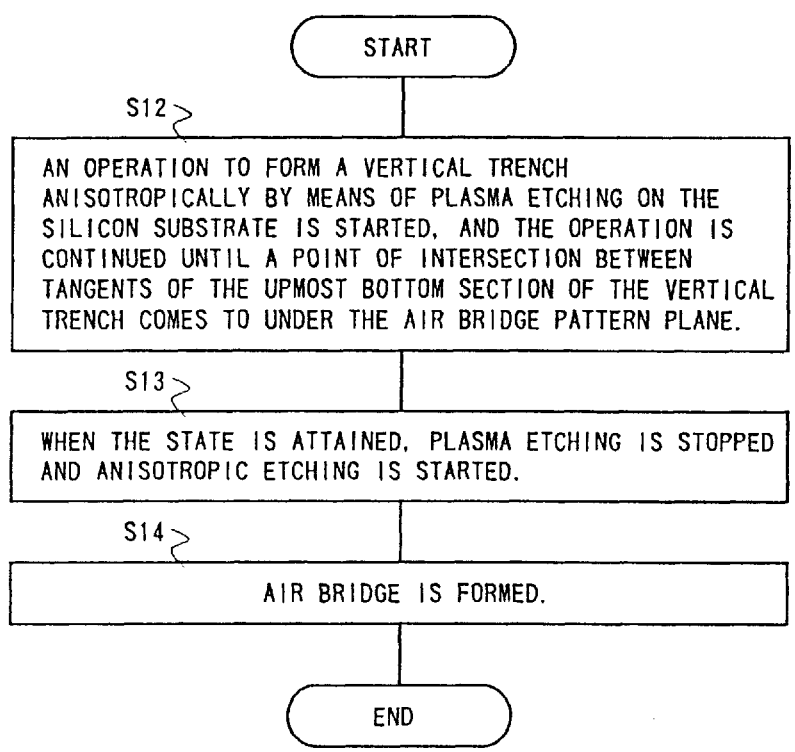
FIG. 12 is a flow chart illustrating an etching method according to Embodiment 4.

FIGS. 11A to 11C are cross sectional views each illustrating a state of the silicon substrate shown in FIG. 1A during the process step taken along lines A—A in FIG. 1A, and FIG. 12 is a flow chart illustrating the process steps. At first, shown in FIG. 11A, an operation to form a vertical trench 1101 anisotropically by means of plasma etching on the silicon substrate 101 is started, and the operation is continued until a point of intersection between tangents of the upmost bottom section of the vertical trench 1101 comes to under the air bridge pattern plane (S12). When the state as shown in FIG. 11B is attained, plasma etching is stopped and anisotropic etching is started (S13). Finally the state as shown in FIG. 11C is attained by means of anisotropic etching and thus an air bridge is formed (S14).

As described above, the same effect as that in Embodiment 1 can be attained also in Embodiment 4. Next description is made for various types of structure of an atmosphere sensor produced by using the etching method for silicon substrate described above.

Figure 13A:
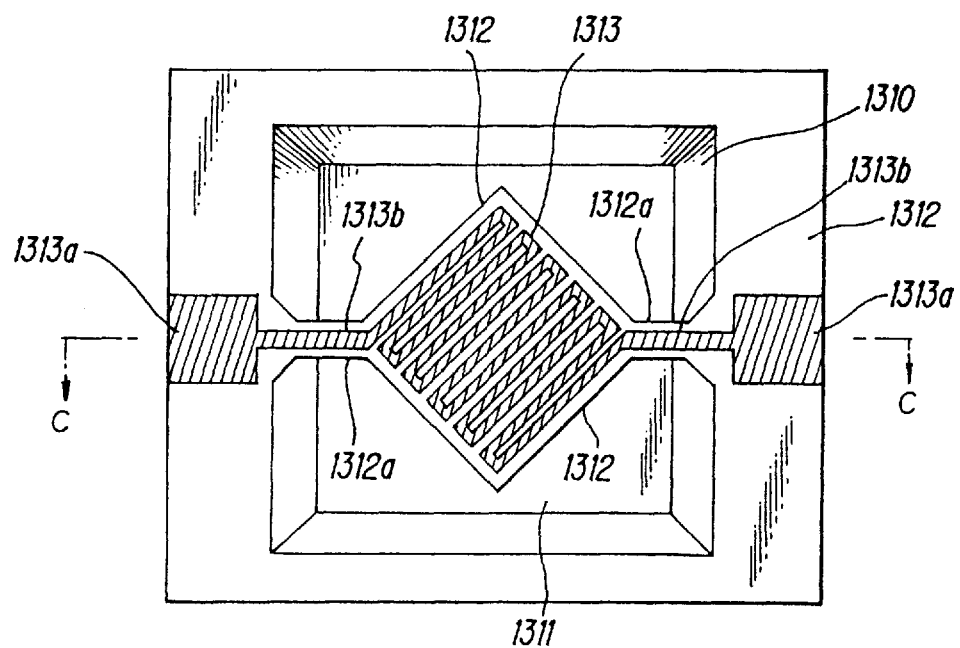
FIG. 13 is a drawing illustrating the structure of a first atmosphere sensor.
Figure 13B:
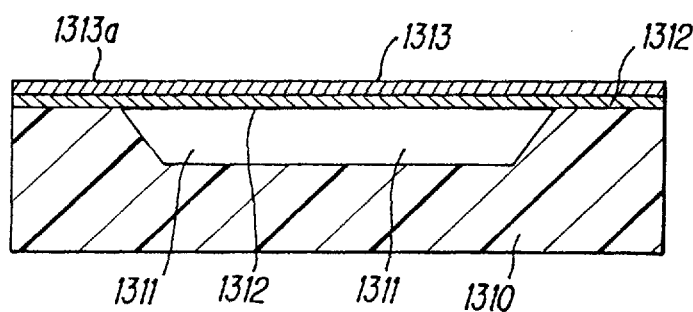

FIGS. 13A and 13B are drawings each illustrating the structure of a first atmosphere sensor, and FIG. 13A is a flat view thereof, while FIG. 13B is a cross sectional view thereof taken along lines C—C, and in the figures, designated at the reference numeral 1310 is a substrate, at 1311 a cavity section, at 1312 a thin film insulating body, and at 1313 a heat generating resistor.

To form a concave section by means of anisotropic etching in a substrate 1310 shown in the figures, silicon is used in this embodiment.

The substrate 1310 is made of Si (100) plane and has a rectangular form, and after a thin film insulating body 1312 made of $SiO_2$ is formed on the upper surface of the substrate 1310, metal such as Pt (platinum) which is stable against oxidization is deposited on the thin film insulating body 1312 to form the heat generating resistor 1313 by using such a method as CVD or sputtering. Then the thin film insulating body 1312 is bridged and supported above the cavity section 1311 by using such a method as lithography or anisotropic etching and the heat generating resistor 1313 made of the metal described above is formed on the thin film insulating body 1312. To the heat generating resistor 1313 are connected a pad section 1313a for energizing formed on the substrate 1310 and a lead section 1313b provided on a bridge section 1312a.

The thin film insulating body 1312 has the same form as the heat generating resistor 1313, an approximately square form slightly larger than the heat generating resisting body 1313, and is supported by the substrate 1312 and the bridge section 1312a on the diagonal line of the square form. The bridge section 1312 has a width smaller than an edge length of the thin film insulating body 1312 and comprises the lead section 1313b to the heat generating resistor 1313. The heat generating resistor 1313 is formed in a continuous and linear form like a zigzag form, said line width narrower than the lead section 1313b, in the entire area indicated by the heat generating resistor 1313, so that a large resistance value can be obtained and also the heat generating resistor 1313 is separated by the lead sections 1313a from the substrate 1310.

In the figure, the thin film insulating body 1312 and the heat generating resistor 1313 are bridged on and supported by the square along the diagonal line thereof, but it may not be bridged along the diagonal line, and also it may be bridged between and supported by opposite edges.

Figure 14:
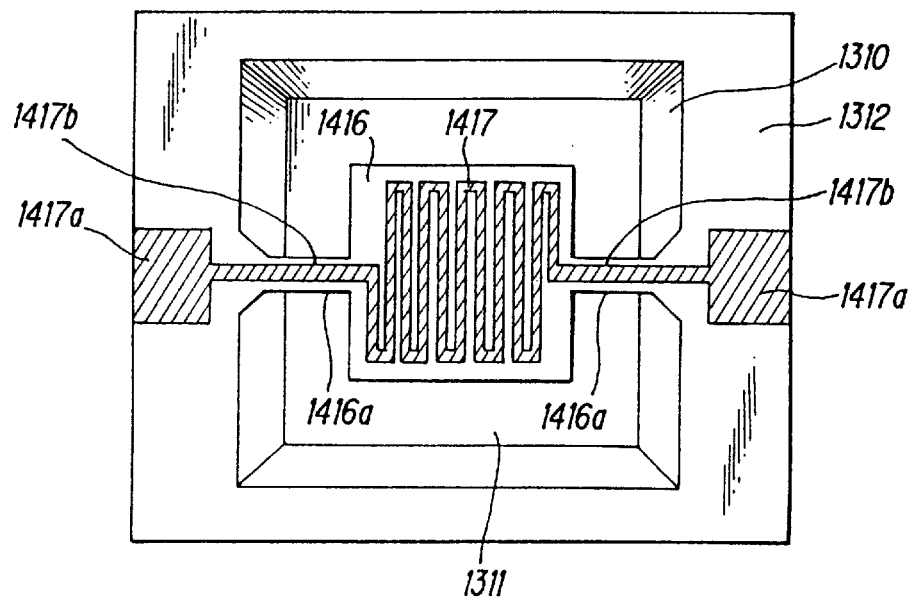
FIG. 14 is a drawing illustrating the structure of a second atmosphere sensor.

FIG. 14 is a drawing illustrating the structure of a second atmosphere sensor, and in this figure, designated at the reference number 1471 is a thin film insulating body, and at 1417a heat generating resistor. Same reference numbers as in FIG. 13 are assigned to sections performing the same functions as those in the figure.

In the figure, a thin film insulating body 1416 is located above the cavity section 1311, has an approximately square form having edges each parallel to edges of the cavity section 1311, and is supported by a bridge section 1416a at a center of each edge of the square-formed substrate 1310. On the thin film insulating body 1416, a heat generating resistor 1417 is connected to a plane having the approximately same plane as that of the thin film insulating body 1416 in a continuous and linear form with a pad section 1417a and a lead section 1417b.

Figure 15:
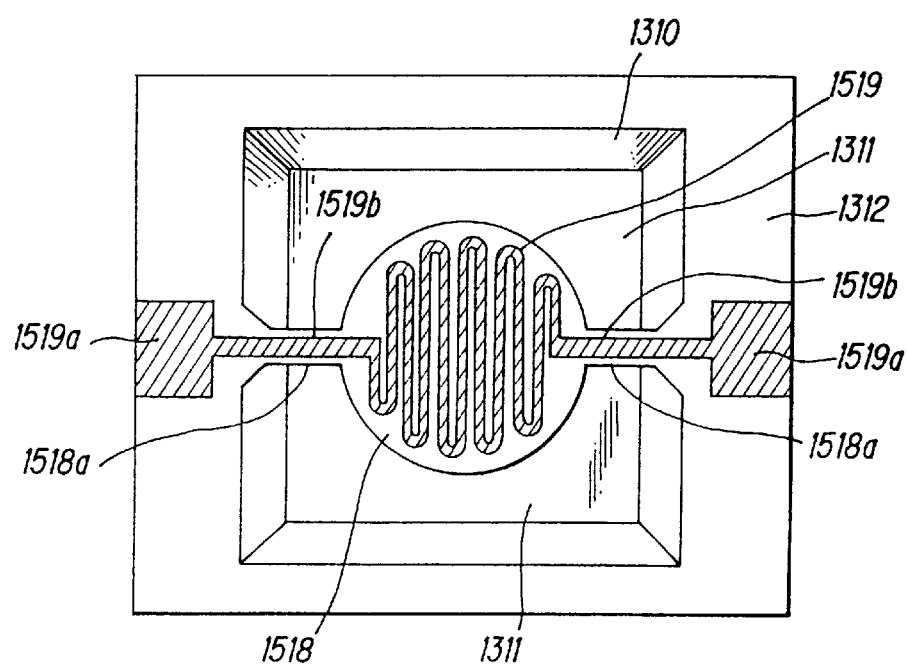
FIG. 15 is a drawing illustrating the structure of a third atmosphere sensor.

FIG. 15 is a drawing illustrating the structure of a third atmosphere sensor, and in this figure, designated at the reference number 1518 is a thin film insulating body, and at 1519 is a heat generating resistor. The same numbers as those in FIG. 13 are assigned to sections having the same functions in the figure.

In this figure, the thin film insulating body 1518 is located above the cavity section 1311, has a circular form with a diameter slightly smaller than an edge of the cavity section 1311, and is supported by bridge supporting sections 1518a provided at both ends of a diameter, said bridge supporting section narrower than a radius of the substrate 1310, on the substrate 1310. On the thin film insulating body 1518 is formed the heat generating resistor 1519 within a circle having a slightly smaller diameter, which are connected to a pad section 1519a with a lead section 1519b. The heat generating resistor 1519 forms a linear and continuous resistor which is narrower than the lead section 1519b and has a spiral or zigzag form between the lead sections 1519b on the both bridge supporting sections 1518a.

Figure 16:
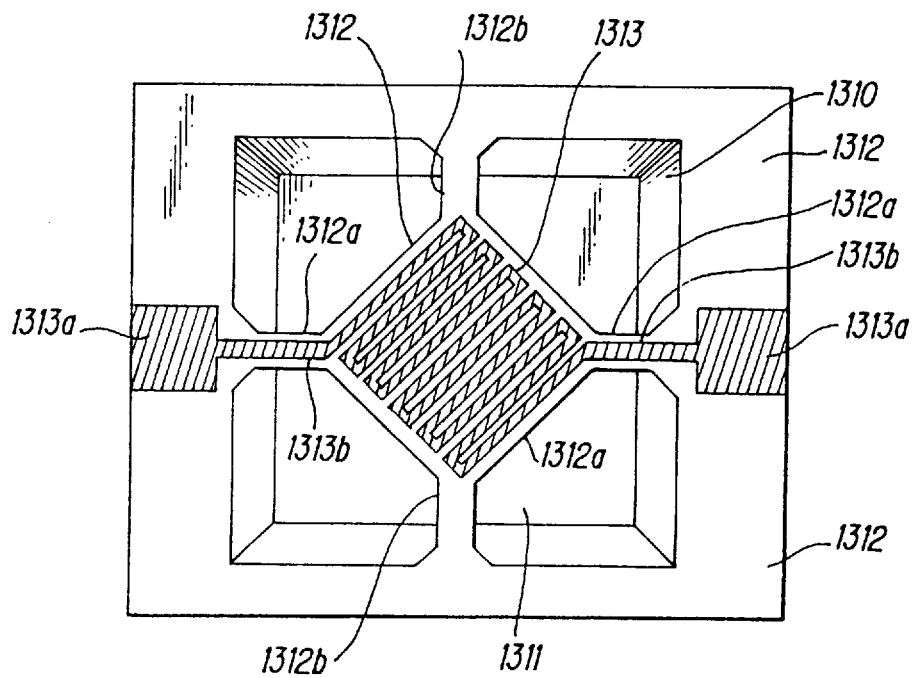
FIG. 16 is a drawing illustrating the structure of a fourth atmosphere sensor.

FIG. 16 is a drawing illustrating the structure of a fourth atmosphere sensor, and in this figure the reference number 1312b is a supporting bridge section for the thin film insulating body with the same reference numbers as in FIG. 13 assigned to sections having the same functions as those in FIG. 13.

As for the structure of the atmosphere sensor shown in the figure, a form of the thin film insulating body on the cavity section 1311 is approximately square as in FIG. 13 and is supported on the substrate with a pair of bridge supporting sections 1312a located at diagonally opposite positions and furthermore also with another pair of bridge supporting section 1312b located at diagonally opposite position; namely at 4 positions in all, so that a torque twisting the shaft can be reduced as compared to a case where the thin film insulating body is supported by only a pair of bridge supporting sections located at diagonally opposite positions and a stable posture can be maintained even when a gas flow rate increases. In the figure, the thin film insulating body is supported at 4 positions, but it may be supported at 3 positions, and furthermore it may be supported at more positions, in which case also the similar stability can be maintained.

The method of supporting a thin film insulating body at many positions is similarly effective in either a case where a thin film insulating body is supported at positions on edges of the square form thereof as shown in FIG. 14 or a case where a thin film insulating body is supported at positions located at opposite ends of a diameter of the circular form thereof as shown in FIG. 15.

As described above, each of the first to fourth atmosphere sensors above can provide the following effects.

(1) A heat generating resistor to detect atmosphere is formed on a thin film insulating body having an approximately square or an approximately circular form above a cavity section on a substrate and also the thin film insulating body is supported by bridge supporting sections each narrower than an edge of the square or a radius of the circular form, so that the substrate is separated from the heat generating resistor. As a result heat conduction does not occur and the heat generating resistor is maintained at a homogeneous temperature.

(2) The heat generating resistor can be formed on the thin film insulating body in a continuous linear form, so that the resistance is high. For this reason, the atmosphere sensor can be driven with small power.

Figure 17:
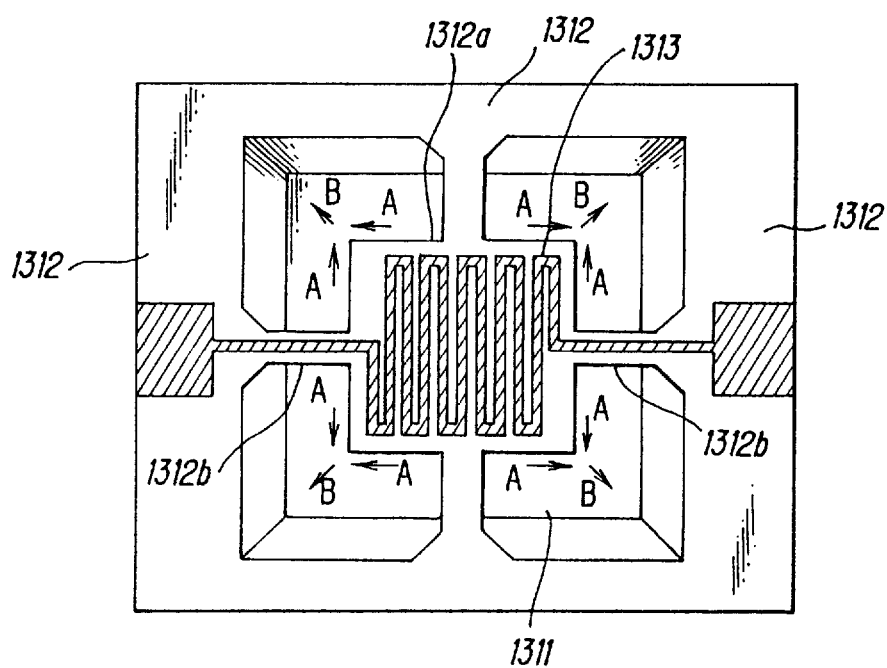
FIG. 17 is a drawing illustrating the structure of a fifth atmosphere sensor.
Figure 18A:
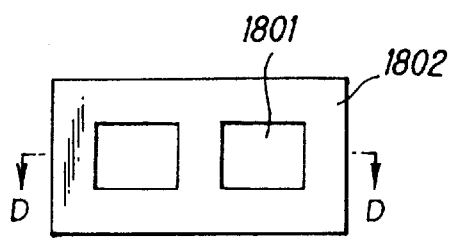
FIG. 18 is a drawing illustrating difference in etching rate for crystal plane of silicon.
Figure 18B:
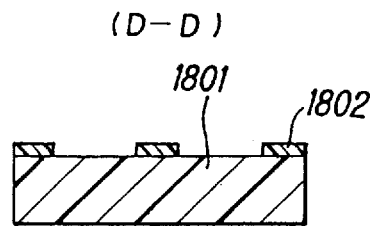
Figure 18C:
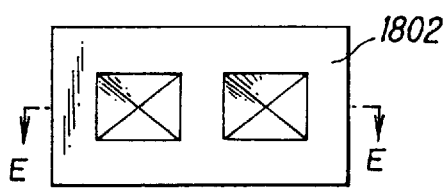
Figure 18D:
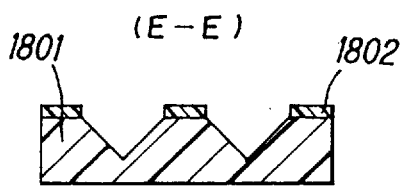
Figure 19A:
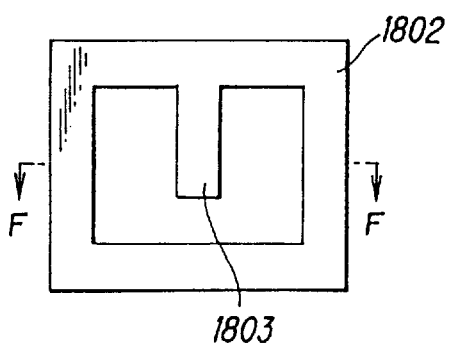
FIG. 19 is a drawing illustrating a conventional type of etching method for silicon substrate.
Figure 19B:
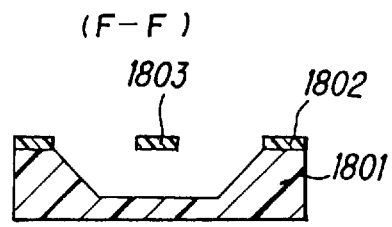
Figure 20A:
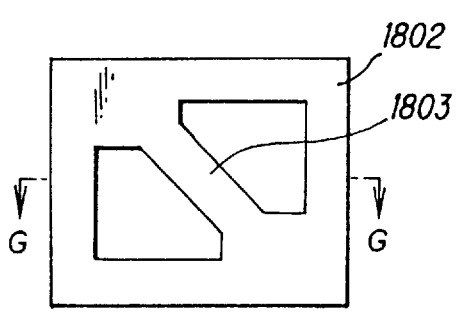
FIG. 20 is a drawing illustrating another conventional type of etching method for silicon substrate.
Figure 20B:
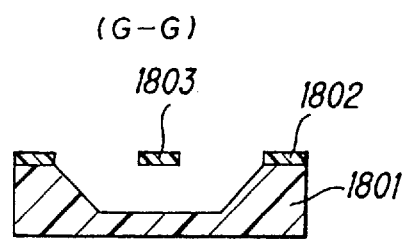
Figure 21A:
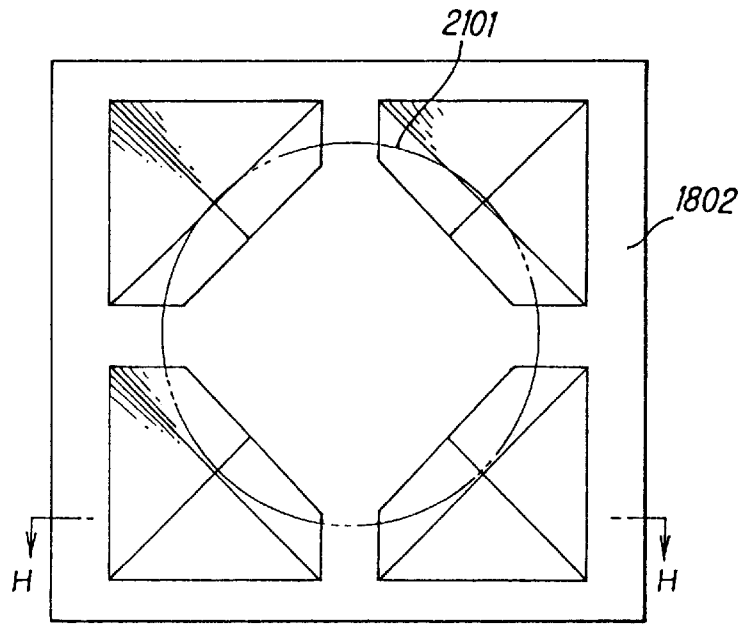
FIG. 21 is a drawing illustrating still another conventional type of etching method for silicon substrate.
Figure 21B:
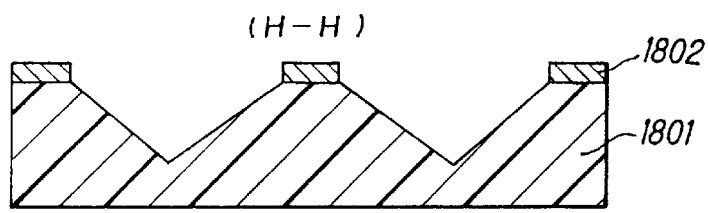
Figure 21C:
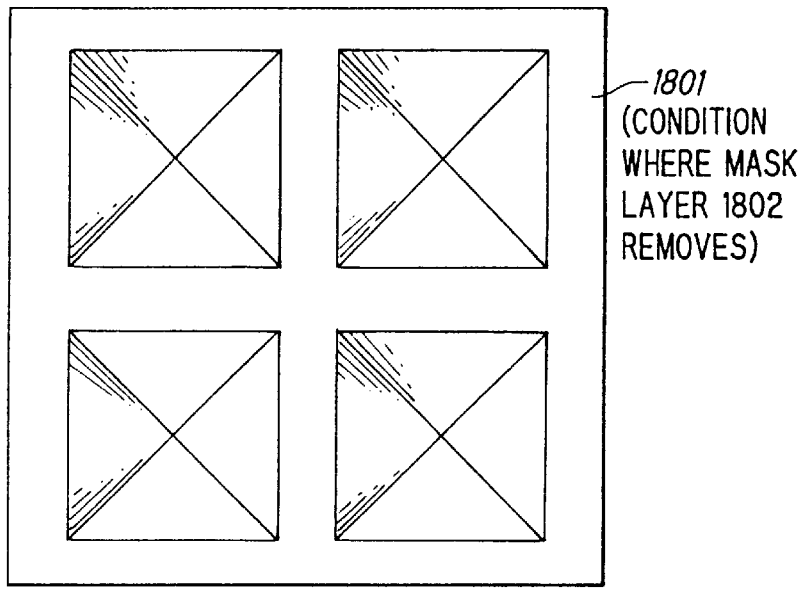

FIG. 17 is a drawing illustrating the structure of a fifth atmosphere sensor, and in this figure the same reference numbers as in FIG. 13 are assigned to the sections having the same functions as those in FIG. 13. In this atmosphere sensor, the bridge section 1312a for the thin film insulating body 1312 is formed in an approximately square form and is supported at a central position of each edge of the square form by the bridge supporting sections 1312b. For this reason, in the present invention, thermal expansion in the bridge section 1312a of the thin film insulating body works in the directions as indicated by arrows A in the figure, but extension due to the thermal expansion can escape in the directions indicated by arrows B, so that any stress does not work to the bridge sections 1312b of the thin film insulating body 1312 and the thin film insulating body will never be broken mechanically.

In the fifth atmosphere sensor described above, even if a thin film insulating body bridged over a cavity section on a substrate expands due to heat from a heat generating resistor provided on the thin film insulating body, expanded sections due to the thermal expansion can effectively be released, so that mechanical breakage of the bridge sections due to thermal expansion can be prevented.

As described above, the etching method for silicon substrate according to the present invention comprises a step of forming a mask layer including an air bridge pattern on a (100) plane of silicon substrate, a step of carrying out isotropic etching until a point of intersection between tangents of a peripheral curved plane undercut under the air bridge pattern comes to under the air bridge pattern plane, and a step of forming an air bridge by means of anisotropic etching, so that a freedom of layout including an air bridge pattern can be enlarged and also the availability for various purposes can be enhanced.

Also the etching method for silicon substrate according to the present invention comprises a step of forming a mask layer including an air bridge on a (100) plane of silicon substrate, a step of generating defects in the crystal structure in a portion of the silicon substrate having no mask layer thereon, and a step of forming an air bridge by means of anisotropic etching, so that a freedom of layout including an air bridge pattern can be enlarged and also the availability for various purposes can be enhanced.

Furthermore the etching method for silicon substrate comprises a step of forming a mask layer including an air bridge pattern on a (100) plane of a silicon substrate, a step of generating isotropic defects in the crystal structure of a silicon substrate by electrically irradiating ions of inactive element which is heavier than Si, and a step of forming an air bridge by means of anisotropic etching, so that a freedom of layout including an air bridge pattern can be enlarged and also the availability for various purposes can be enhanced.

Still furthermore the etching method for silicon substrate according to the present invention comprises a step of forming a mask layer including an air bridge pattern on a (100) plane of a silicon substrate, a step of generating isotropic defects in the crystal structure of the silicon substrate by irradiating ions of inactive element which is heavier than Si using the sputter etching process, and a step of forming an air bridge by means of anisotropic etching, so that a freedom of layout including an air bridge pattern can be enlarged and also the availability for various purposes can be enhanced.

In addition the etching method for silicon substrate comprises a step of forming a mask layer including an air bridge pattern on a (100) plane of a silicon substrate, a step of forming a vertical trench on the silicon substrate using the plasma etching process, and a step of forming an air bridge by means of anisotropic etching, so that a freedom of layout including an air bridge pattern can be enlarged and also the availability for various purposes can be enhanced.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of etching a silicon substrate, for forming an air bridge by making use of differences in etching rates for respective crystal planes of a silicon substrate, comprising the steps of:

forming a mask layer including an air bridge pattern on a (100) plane of the silicon substrate;

isotropically etching the silicon substrate to undercut sections on opposite sides of the air bridge pattern, each undercut section having a curved peripheral portion under the air bridge pattern, and continuing isotropic etching until tangents to the curved peripheral portions intersect under a plane of said air bridge pattern; and forming an air bridge by anisotropic etching.

2. A method of etching a crystal silicon substrate, for forming an air bridge by making use of differences in etching rates for respective crystal planes of a silicon substrate, comprising the steps of:

forming a mask layer including an air bridge pattern on a (100) plane of the silicon substrate;

irradiating said silicon substrate in a portion thereof which is not covered by said mask layer to form defect regions on opposite sides of the air bridge pattern, each defect region having a curved peripheral portion under the air bridge pattern, and continuing irradiating to increase the defect regions until tangents to the curved peripheral portions intersect under a plane of the air bridge pattern; and forming an air bridge by anisotropic etching.

* * * * *